(12) United States Patent
Ferrari et al.

(10) Patent No.: US 7,538,302 B2
(45) Date of Patent: May 26, 2009

(54) INDUCTION SEALING DEVICE AND METHOD WHICH MAY BE USED FOR PRODUCING PACKAGES OF POURABLE FOOD PRODUCTS

(75) Inventors: Claudio Ferrari, Fiorano Modenese (IT); Antonio Melandri, Rubiera (IT); Saquib Javed, Bagno (IT); Giorgio Galavotti, Concordia (IT)

(73) Assignee: Tetra Laval Holdings & Finance SA, Pully (CH)

( * ) Notice: Subject to any disclaimer, the term of this patent is extended or adjusted under 35 U.S.C. 154(b) by 184 days.

(21) Appl. No.: 10/551,206

(22) PCT Filed: Mar. 26, 2004

(86) PCT No.: PCT/EP2004/050385

§ 371 (c)(1),
(2), (4) Date: Jun. 16, 2006

(87) PCT Pub. No.: WO2004/085253

PCT Pub. Date: Oct. 7, 2004

(65) Prior Publication Data

US 2006/0242928 A1 Nov. 2, 2006

(30) Foreign Application Priority Data

Mar. 28, 2003 (IT) .......................... TO2003A0238

(51) Int. Cl.
*H05B 6/14* (2006.01)
*H05B 6/00* (2006.01)

(52) U.S. Cl. ...................... 219/633; 219/618
(58) Field of Classification Search .......... 219/618–633
See application file for complete search history.

(56) References Cited

U.S. PATENT DOCUMENTS 4,511,956 A * 4/1985 Dewan et al. .................. 363/49
4,825,625 A * 5/1989 Hufford ....................... 53/451

(Continued)

FOREIGN PATENT DOCUMENTS

RU 2121416 C1 11/1998

(Continued)

OTHER PUBLICATIONS

Russian Official Action (Decision on Grant) issued in corresponding RU 2005133218/12(037185), Mar. 25, 2008; and English-language translation thereof.

*Primary Examiner*—Daniel L Robinson
(74) *Attorney, Agent, or Firm*—Buchanan Ingersoll & Rooney, PC

(57) ABSTRACT

An induction sealing device which may be used for producing packages of pourable food products by transversely sealing a tube of sheet packaging material having at least one layer of induction heatable material covered with plastic material. The sealing device has: a generator for generating an alternating power signal; an inductor receiving the alternating power signal to induce a parasitic electric current in the layer and locally melt the plastic material to form a transverse seal; and a matching circuit for achieving optimum power transfer between the generator and the inductor. The matching circuit includes an inductive-capacitive circuit, in which the capacitance of a variable capacitance capacitive element is adjustable so that the current-voltage phase angle is close to zero.

14 Claims, 1 Drawing Sheet

U.S. PATENT DOCUMENTS

| | | | |
|---|---|---|---|
| 5,170,040 A * | 12/1992 | Wirtz et al. | 219/497 |
| 5,250,777 A * | 10/1993 | Fishman | 219/619 |
| 5,523,631 A * | 6/1996 | Fishman et al. | 307/38 |
| 5,710,413 A | 1/1998 | King et al. | |
| 5,889,263 A | 3/1999 | Andersson | |
| 6,085,495 A | 7/2000 | Fontanazzi et al. | |

FOREIGN PATENT DOCUMENTS

| | | |
|---|---|---|
| RU | 2153778 C2 | 7/2000 |
| RU | 2158216 C2 | 10/2000 |
| RU | 2179944 C2 | 2/2002 |
| SU | 1001510 | 2/1983 |
| WO | 99/52776 | 10/1999 |

* cited by examiner

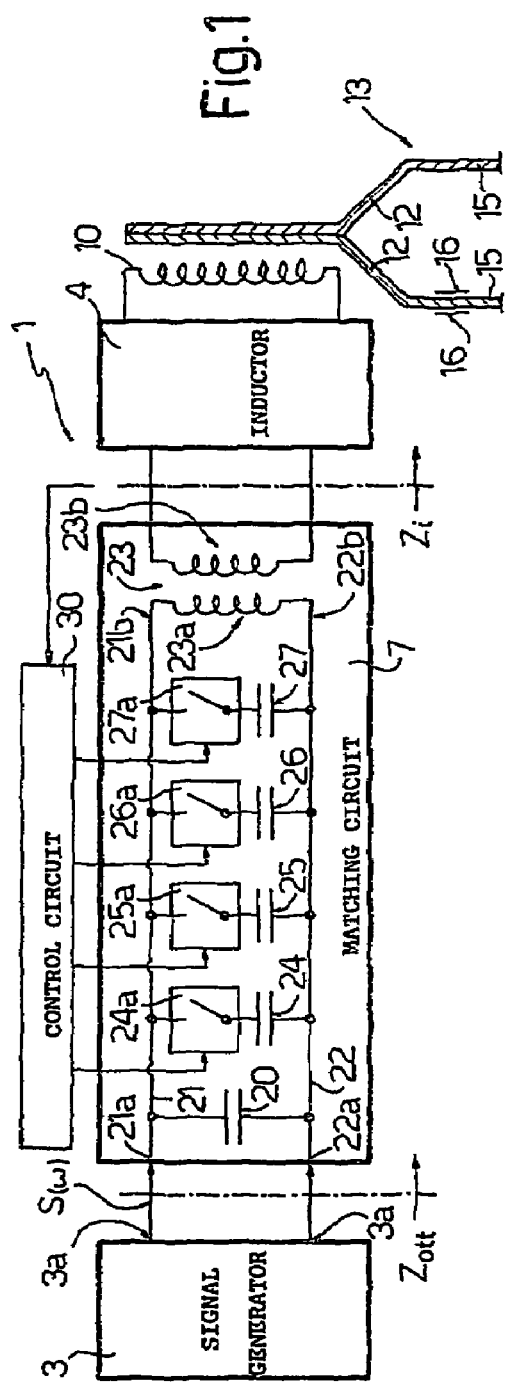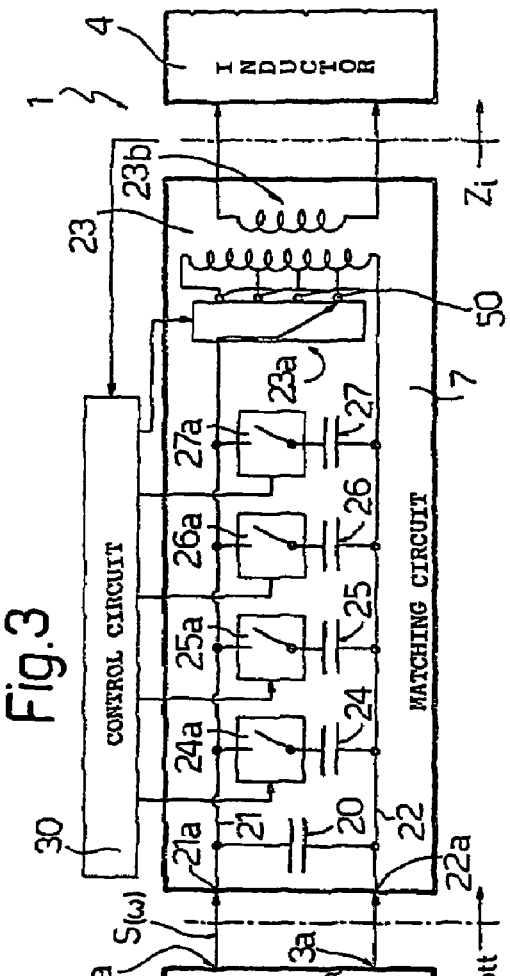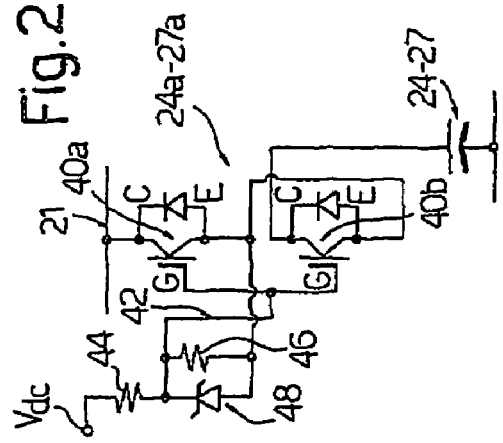

INDUCTION SEALING DEVICE AND METHOD WHICH MAY BE USED FOR PRODUCING PACKAGES OF POURABLE FOOD PRODUCTS

This application is the U.S. National Stage Application under 35 U.S.C. § 371 of International Application No. PCT/EP2004/050385, filed on Mar. 26, 2004 designating the U.S., and claims priority under 35 U.S.C. § 119 with respect to Italian Application No. TO2003A000238, filed on Mar. 28, 2003, the entire contents of both of which are hereby incorporated by reference.

TECHNICAL FIELD

The present invention relates to an induction sealing device and method which may be used for producing packages of pourable food products.

In particular, the invention may be used preferably, though not exclusively, in a form-and-seal unit for forming and sealing packages from a tube of sheet packaging material filled continuously with a pourable product.

BACKGROUND ART

As is known, many pourable food products (e.g. fruit or vegetable juice, pasteurized or UHT (ultra-high-temperature-treated) milk, wine, etc.) are sold in packages made of sterilized packaging material.

A typical example of this type of package is the parallelepiped-shaped package for pourable food products known as Tetra Brik Aseptic®, which is made by folding and sealing a web of laminated packaging material.

The laminated packaging material comprises layers of fibrous material, e.g. paper, covered on both sides with heat-seal plastic material, e.g. polyethylene, and, in the case of aseptic packages for long-storage products, such as UHT milk, also comprises, on the side eventually contacting the food product in the package, a layer of oxygen-barrier material, e.g. a sheet of aluminium or EVOH, which in turn is covered with one or more layers of heat-seal plastic material.

As is known, such packages are produced on fully automatic packaging machines, on which a continuous tube is formed from the web-fed packaging material; the web of packaging material is sterilized on the packaging machine itself, e.g. by applying a chemical sterilizing agent, such as a hydrogen peroxide solution, which, once sterilization is completed, is removed, e.g. vapourized by heating, from the surfaces of the packaging material; and the web of packaging material so sterilized is kept in a closed, sterile environment, and is folded and sealed longitudinally to form a vertical tube.

The tube is then filled from the top with the sterilized or sterile-processed pourable food product, and is gripped at equally spaced transverse sections by two pairs of jaws. More specifically, the pairs of jaws act cyclically and successively on the tube to seal the packaging material of the tube and form a continuous strip of pillow packs connected to one another by respective transverse sealing bands.

The pillow packs are separated by cutting the relative sealing bands, and are then conveyed to a final folding station where they are folded mechanically into the finished parallelepiped shape.

In the case of aseptic packages with an aluminium layer as the barrier material, the transverse sections of the tube are normally sealed using a sealing device for inducing a parasitic electric current in the aluminium layer to melt the heat-seal plastic material locally.

More specifically, one of the jaws in each pair comprises a main body made of non-conducting material, and an inductor housed in a front seat on the main body; and the other jaw has pressure pads made of elastically yielding material, such as rubber.

The inductor is powered when the relative pair of jaws is gripped onto the tube, so as to seal a transverse section of the tube by sealing the plastic material covering.

More specifically, in addition to the inductor, the sealing device also comprises an alternating power signal generator, and a matching circuit for optimizing power transfer between the generator and inductor. The generator, in fact, supplies maximum power when the current-voltage phase angle is close to zero.

Known matching circuits are normally defined by an inductive-capacitive circuit, in which a capacitive element (normally defined by a number of parallel capacitors) is connected parallel to an inductive element (normally defined by a transformer); and the capacitance values of the capacitive element, and the inductance value of the inductive element are so selected as to produce phasing whereby the current-voltage phase angle is close to zero. Such phasing, however, is best for a predetermined electric load associated with given operating conditions (e.g. package volume, filling machine output rate and operating speed, type of inductor, etc.).

Consequently, alongside a variation in electric load caused by varying operating conditions, there is a noticeable departure from the optimum phasing condition, thus reducing power transfer to the inductor.

DISCLOSURE OF INVENTION

It is an object of the present invention to provide a sealing device designed to eliminate the drawbacks of known devices.

According to the present invention, there is provided an induction sealing device which may be used for producing packages of pourable food products by transversely sealing a tube of sheet packaging material comprising at least one layer of induction-heatable material covered with plastic material, said sealing device comprising: generating means for generating an alternating power signal $S(\omega)$; at least one inductor receiving the alternating power signal $S(\omega)$ to induce a parasitic electric current in said layer and locally melt said plastic material to form a transverse seal; and a matching circuit for achieving optimum power transfer between said generator and said inductor; characterized in that said matching circuit comprises an inductive-capacitive circuit, in which at least one inductive element is connected to at least one variable-capacitance capacitive element; the capacitance of the capacitive element being adjustable so that the current-voltage phase angle is close to zero.

The present invention also relates to an induction sealing method which may be used for producing packages of pourable food products by transversely sealing a tube of sheet packaging material comprising at least one layer of induction-heatable material covered with plastic material, said method comprising the steps of: generating an alternating power signal $S(\omega)$; supplying said alternating power signal $S(\omega)$ to at least one inductor to induce a parasitic electric current in said layer and locally melt said plastic material to form a transverse seal; and optimizing power transfer between said generator and said inductor by means of a matching circuit; characterized in that said optimizing step comprises the steps of adjusting the capacitance of at least one capacitive element connected to at least one inductive element so that the current-voltage phase angle is close to zero.

BRIEF DESCRIPTION OF THE DRAWINGS

A preferred, non-limiting embodiment of the invention will be described by way of example with reference to the accompanying drawings, in which:

FIG. 1 shows a simplified electric diagram of an induction sealing device which may be used for producing packages of pourable food products;

FIG. 2 shows a portion of the FIG. 1 device in more detail;

FIG. 3 shows a variation of the FIG. 1 device.

BEST MODE FOR CARRYING OUT THE INVENTION

Number 1 in FIG. 1 indicates as a whole an induction sealing device which may be used for producing packages of pourable food products.

More specifically, sealing device 1 comprises a generator 3 for generating an alternating power signal $S(\omega)$; an inductor 4 which receives alternating power signal $S(\omega)$; and a matching circuit 7 for optimizing power transfer between generator 3 and inductor 4.

More specifically, generator 3 may conveniently generate a variable-voltage (e.g. sinusoidal) signal of medium frequency (e.g. 530 kHz) with a peak voltage of around a few hundred (e.g. 540) volts, may generate a continuous or pulsed alternating power signal $S(\omega)$, and supplies maximum power (e.g. 2500 watts) when the phase angle between the current and voltage (both measured at the output of generator 3) is close to zero.

Inductor 4 is conveniently defined by a winding 10 which receives alternating power signal $S(\omega)$ to generate a pulsating magnetic field which in turn produces a parasitic electric current in an aluminium sheet 12 forming part of a vertical tube 13 (shown partly and not to scale) made from an appropriately shaped web of laminated packaging material.

The laminated packaging material comprises a central layer 15 of fibrous material (e.g. paper) covered on both sides with a heat-seal plastic material 16, e.g. polyethylene; aluminium sheet 12 is interposed between the central layer 15 of fibrous material and one of the layers of plastic material 16; and the parasitic current locally melts the plastic material 16 of two contacting portions of vertical tube 13 to seal tube 13 transversely.

Matching circuit 7 comprises at least one first capacitor 20 interposed between a first and a second electric line 21, 22; and a number of capacitors 24, 25, 26, 27 (four in the example shown, but which may obviously be of any other number) connectable/disconnectable to/from electric lines 21, 22 on the basis of control signals acting on respective switches 24a, 25a, 26a, 27a. Capacitor 20 may conveniently be defined by a number of parallel capacitors (e.g. three—not shown), and may conveniently have a capacitance of around 14-40 nF.

More specifically, first ends 21a, 22a of electric lines 21, 22 define the input of matching circuit 7, and second ends 21b, 22b of electric lines 21, 22 are connected to the end terminals of a primary winding 23a of a transformer 23 having a secondary winding 23b defining an output of matching circuit 7. Transformer 23 preferably has a ferrite core, and windings 23a, 23b made of Litz conductors to greatly reduce internal losses.

Matching circuit 7 therefore defines an inductive-capacitive circuit comprising an inductive element (defined by winding 23a of transformer 23) parallel to a capacitive element of variable capacitance which is modified by connecting one or more capacitors 24, 25, 27, 27 parallel to capacitor 20.

According to the present invention, the capacitance value of the capacitive element is regulated so that the current-voltage phase angle is close to zero.

The capacitance is conveniently regulated by a control circuit 30 which measures parameters (e.g. the instantaneous value of the current-voltage phase angle $\phi$ at the output of generator 3 and/or the impedance at the output of generator 3, i.e. the input impedance of matching circuit 7) during the package production process, and determines the target capacitance $C_{targ}$ the capacitance element must have to obtain a current-voltage phase angle close to zero. The current and voltage are measured at the output of generator 3 by a known instrument (not shown) which measures the instantaneous values of voltage V, current I, and phase angle $\phi$.

A control signal is thus sent to one or more switches 24a, 25a, 26a, 27a to connect one or more capacitors 24, 25, 26, 27 parallel to capacitor 20 and achieve the determined target capacitance $C_{targ}$. Variations in operating conditions therefore vary the parameters supplied to control circuit 30, which opens/closes a predetermined combination of switches 24a, 25a, 26a, 27a, so that the total capacitance satisfies the above condition.

FIG. 2 shows an example embodiment of one of switches 24a-27a. More specifically, each of switches 24a-27a comprises a first and a second IGBT transistor 40a, 40b having emitters (E) connected to each other, and collectors (C) connected respectively to electric line 21 and to an end terminal of respective capacitor 24-27. The gates (G) of IGBT transistors 40a, 40b are connected to each other by an electric line 42 which, via a resistor 44, receives the command in voltage $V_{dc}$ (e.g. 24 volts) defining the control signal to turn IGBT transistors 40a, 40b on/off. A resistor 46 is interposed between the gates (G) and the emitters (E) of IGBT transistors 40a, 40b to discharge the current stored in the internal capacitors of the IGBT transistors when these are off. A Zener diode 48 is also interposed between the gates (G) and the emitters (E) of IGBT transistors 40a, 40b to limit the voltage $V_{ge}$ of the IGBT transistors to a predetermined maximum value (e.g. 16 volts).

A recirculating diode is interposed between the collector (C) and emitter (E) of each IGBT transistor to permit current flow during the half-wave opposite that of direct flow through the IGBT transistor (which is a one-way device).

Alternatively, a first and second MOSFET transistor (not shown) may be used, with the sources (S) connected to each other, and the drains (D) connected respectively to electric line 21 and to an end terminal of respective capacitor 24-27.

In the FIG. 3 variation, device 1 also defines a variable-inductance inductive element parallel to the variable-capacitance capacitive element.

In the non-limiting embodiment in FIG. 3, the variable inductance is defined by a transformer 23 having a primary winding 23a with a number of inputs 50 associated with respective turns and so producing, when selected, different transformation ratios of transformer 23. Inputs 50 are connected selectively to lines 21 and 22 on the basis of a control signal from control circuit 30. More specifically, inputs 50 are selected to alter the inductance of the matching circuit, so that the input impedance of matching circuit 7 (i.e. the impedance "seen" by signal generator 3) assumes a value close to an optimum impedance value $Z_{ott}$ (e.g. 50 ohms) to maximize power transfer from generator 3 to inductor 4.

The invention claimed is:

1. An induction sealing device for producing packages of pourable food products by transversely sealing a tube of sheet packaging material comprising at least one layer of induction heatable material covered with plastic material, said sealing device comprising:

generating means for generating an alternating power signal, said alternating power signal having a current-voltage phase angle;

at least one inductor receiving the alternating power signal to induce a parasitic electric current in said layer and locally melt said plastic material to form a transverse seal; and a matching circuit for achieving optimum power transfer between said generating means and said inductor;

wherein said matching circuit comprises an inductive-capacitive circuit, in which at least one inductive element is connected to at least one variable-capacitance capacitive element; the capacitance of the capacitive element being adjustable so that the current-voltage phase angle is close to zero.

2. A sealing device as claimed in claim 1, wherein said inductive element and said capacitive element are parallel to each other.

3. A sealing device as claimed in claim 1, wherein said capacitive element comprises at least one main capacitor, and a number of auxiliary capacitors selectively connectable/disconnectable parallel to said main capacitor.

4. A sealing device as claimed in claim 3, wherein switching devices are connected to respective auxiliary capacitors to switch respective auxiliary capacitors on/off.

5. A sealing device as claimed in claim 4, wherein each switching device comprises a first and a second IGBT transistor having emitters connected to each other, and collectors communicating respectively with an electric line communicating with the main capacitor, and with an end terminal of a respective auxiliary capacitor; the gates of said IGBT transistors being connected to each other, and receiving a voltage command $V_{da}$ to turn said IGBT transistors on/off.

6. A sealing device as claimed in claim 5, wherein at least one resistor is interposed between the gates and the emitters of the IGBT transistors; said resistor ensuring discharge of the current stored in the internal capacitors of the IGBT transistors when these are off.

7. A sealing device as claimed in claim 5, wherein at least one Zener diode is interposed between the gate and the emitter of each IGBT transistor; said Zener diode limiting the voltage $V_{ga}$ of the IGBT transistor to a predetermined maximum value.

8. A sealing device as claimed in claim 1, wherein said inductive element has a variable inductance value; said inductance value being regulated so that the impedance of said matching circuit assumes a value close to an optimum impedance value $Z_{ott}$, to maximize power transfer from said generating means to said inductor.

9. A sealing device as claimed in claim 8, wherein said inductive element comprises a transformer having a primary winding with a number of inputs associated with respective turns and so producing, when selected, different transformation ratios of the transformer.

10. An induction sealing method for producing packages of pourable food products by transversely sealing a tube of sheet packaging material comprising at least one layer of induction-heatable material covered with plastic material said method comprising the steps of:

generating an alternating power signal by means of a generator, said alternating power signal having a current-voltage phase angle;

supplying said alternating power signal to at least one inductor to induce a parasitic electric current in said layer and locally melt said plastic material to form a transverse seal; and optimizing power transfer between said generator and said inductor by means of a matching circuit;

wherein said optimizing step comprises adjusting the capacitance of at least one capacitive element connected to at least one inductive element so that the current-voltage phase angle is close to zero.

11. A sealing method as claimed in claim 10, and comprising the step of regulating the inductance value of said inductive element so that the impedance seen by said generator assumes a value close to an optimum impedance value $Z_{ott}$, to maximize power transfer from said generator to said inductor.

12. A sealing device as claimed in claim 2, wherein said capacitive element comprises at least one main capacitor, and a number of auxiliary capacitors selectively connectable/disconnectable parallel to said main capacitor.

13. A sealing device as claimed in claim 8, wherein the optimum impedance value $Z_{ott}$ is 50 ohms.

14. A sealing method as claimed in claim 11, wherein the optimum impedance value $Z_{ott}$ is 50 ohms.

* * * * *